United States Patent
Ming et al.

(10) Patent No.: US 7,064,600 B1
(45) Date of Patent: *Jun. 20, 2006

(54) LIMIT SWING CHARGE PUMP AND METHOD THEREOF

(75) Inventors: Jun Ming, Fremont, CA (US); Randy Tsang, Foster City, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 10/703,375

(22) Filed: Nov. 7, 2003

Related U.S. Application Data

(63) Continuation of application No. 10/219,225, filed on Aug. 13, 2002, now Pat. No. 6,747,520, which is a continuation-in-part of application No. 10/195,047, filed on Jul. 12, 2002.

(51) Int. Cl.
*G05F 1/10* (2006.01)

(52) U.S. Cl. ............... 327/536; 327/537; 327/157; 363/59; 363/60; 307/110

(58) Field of Classification Search ............... 327/534, 327/536, 537, 157, 108, 112; 307/110; 363/59, 363/60
See application file for complete search history.

(56) References Cited

U.S. PATENT DOCUMENTS

| | | | |
|---|---|---|---|
| 4,430,641 A | 2/1984 | Baur et al. | 340/347 DA |
| 5,066,871 A | 11/1991 | Wilcox | 327/536 |
| 5,359,299 A | 10/1994 | Webster | 331/8 |
| 5,392,205 A | 2/1995 | Zavaleta | 363/59 |
| 5,629,843 A | 5/1997 | Loughmiller et al. | 363/60 |
| 5,642,082 A * | 6/1997 | Jefferson | 331/25 |
| 6,160,723 A | 12/2000 | Liu | 363/60 |
| 6,208,197 B1 | 3/2001 | Ternullo, Jr. et al. | 327/536 |
| 6,215,361 B1 * | 4/2001 | Lebouleux et al. | 331/17 |
| 6,278,317 B1 | 8/2001 | Hsu et al. | 327/536 |
| 6,313,707 B1 | 11/2001 | Fischer et al. | 331/17 |
| 6,566,846 B1 | 5/2003 | Voo | 323/267 |
| 2002/0036538 A1 | 3/2002 | Choi | |

OTHER PUBLICATIONS

IEEE std. 802.11b—*1999, Sponsor LAN MAN Standards Committee of IEEE Computer Society,* "Part 11: Wireless LAN Medium Access Control (MAC) and Physical Layer (PHY) Specifications, Higher–Speed Physical Layer Extension in 2.4 GHz Band,".

* cited by examiner

*Primary Examiner*—Timothy P. Callahan
*Assistant Examiner*—An T. Luu

(57) ABSTRACT

A charge pump comprising a charge pump core including output switches. The charge pump core, in response to a drive signal, to generate a charge pump output. A limit swing generator, in response to an input signal, to generate the drive signal to control the charge pump core. The drive signal having voltage levels including a high level and a low level. The limit swing generator including at least one voltage generator to control the voltage levels of the drive signal such that the drive signal tracks a process variable of the output switches. The at least one voltage generator including at least one diode or diode connected device.

23 Claims, 7 Drawing Sheets

LIMIT SWING CHARGE PUMP AND METHOD THEREOF

CROSS-REFERENCE TO RELATED APPLICATIONS

This application is a continuation of and claims priority to U.S. application Ser. No. 10/219,225, Limit Swing Charge Pump and Method Thereof, filed on Aug. 13, 2002, now U.S. Pat. No. 6,747,520, the contents of which are incorporated by reference.

This application is a continuation-in-part application of and claims priority to U.S. application Ser. No. 10/195,047, Limit Swing Charge Pump and Method Thereof, filed on Jul. 12, 2002, the contents of which are incorporated by reference.

TECHNICAL FIELD

An aspect of this invention relates to charge pumps.

BACKGROUND

A charge pump circuit used in a Phase Lock Loop (PLL) generates an error signal based on a phase difference between two inputs. Within the charge pump circuit, both charge and discharge currents flow. Transient errors may occur in the output current of the charge pump circuit due to asymmetries between the charge and discharge currents. When the charge pump circuit is included in a PLL, the transient error in the output current may cause an increase in reference spurs near the carrier frequency.

SUMMARY

A charge pump comprising a charge pump core including output switches. The charge pump core, in response to a drive signal, to generate a charge pump output. A limit swing generator, in response to an input signal, to generate the drive signal to control the charge pump core. The drive signal having voltage levels including a high level and a low level. The limit swing generator including at least one voltage generator to control the voltage levels of the drive signal such that the drive signal tracks a process variable of the output switches. The at least one voltage generator including at least one diode or diode connected device.

The details of one or more embodiments of the invention are set forth in the accompanying drawings and the description below.

DESCRIPTION OF DRAWINGS

Like reference symbols in the various drawings indicate like elements.

DETAILED DESCRIPTION

Figure 1:
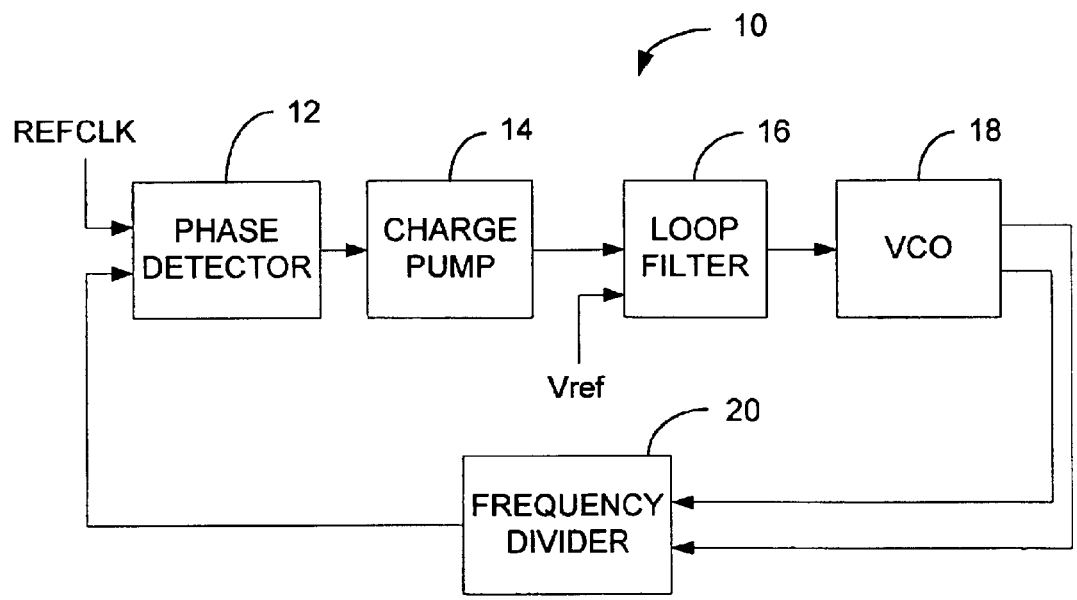
FIG. 1 is a block diagram of a phase lock loop (PLL).

FIG. 1 shows a phase lock loop (PLL) 10 to generate an output signal having a controlled frequency. A digital phase detector 12 compares a reference clock to a feedback signal that is representative of the output signal, and converts the phase difference into error pulses indicating whether an increase or decrease in frequency is required. The error pulses may be implemented using one or more signals to indicate phase difference between the reference clock and the feedback clock. For example, two signals, one an up signal and the other a down signal, may be generated. Additional delays may be inserted into the paths of the up and down signals to equalize the delays in the up and down signals. For example, in a phase detector having two signals, UPA and UPB, representing the up signal, and two signals, DNA and DNB, representing the down signal; transmission gates may be included in the UPA and DNA paths to equalize delays with the UPB and DNB signals.

A charge pump 14 generates an output current in response to the error pulses. The charge pump 14 includes output switches to generate the output current and a limit swing generator to control the voltage levels of drive signals to the output switches. By controlling the drive signal voltage levels, the drive signals may track process variables of the output switches reducing asymmetries in the operation of the output switches. The charge pump 14 may advantageously be used in various applications such as in a Local Area Network (LAN) device that is IEEE 802.11b compliant, IEEE 802.11b-1999 Wireless LAN Medium Access Control (MAC) and Physical Layer (PHY) specifications.

A loop filter 16 may filter the charge pump output voltage and generate a control voltage to be applied to a voltage controlled oscillator (VCO) 18. The VCO 18 generates on output signal having a frequency that is controlled by the control voltage. A frequency divider 20 divides the frequency of the output signal and provides the resulting feedback signal to the phase detector 12.

When the PLL 10 is in lock, the feedback signal is in phase with the reference clock and the phase detector generates up and down pulses that have approximately the same pulse width. Ideally, the charge pump 14 processes both the up and down pulses equivalently so that the charge pump output current is zero. In such a case, the loop completely settles. In a conventional charge pump, circuit asymmetries may cause the charging and discharging currents to be different, leading to periodic disturbances in the charge pump voltage. The charge pump circuit asymmetries may include differences in the output switches such as upper output switches implemented with PMOS and down output switches implemented with NMOS. The periodic disturbances may contribute to spurs near the PLL output frequency.

In the present charge pump 14, the impact of circuit asymmetries is minimized resulting in a reduction of spurs in the PLL output frequency. The limit swing generator may adjust the drive signal voltage levels to compensate for process variables associated with the output switches.

Figure 2:
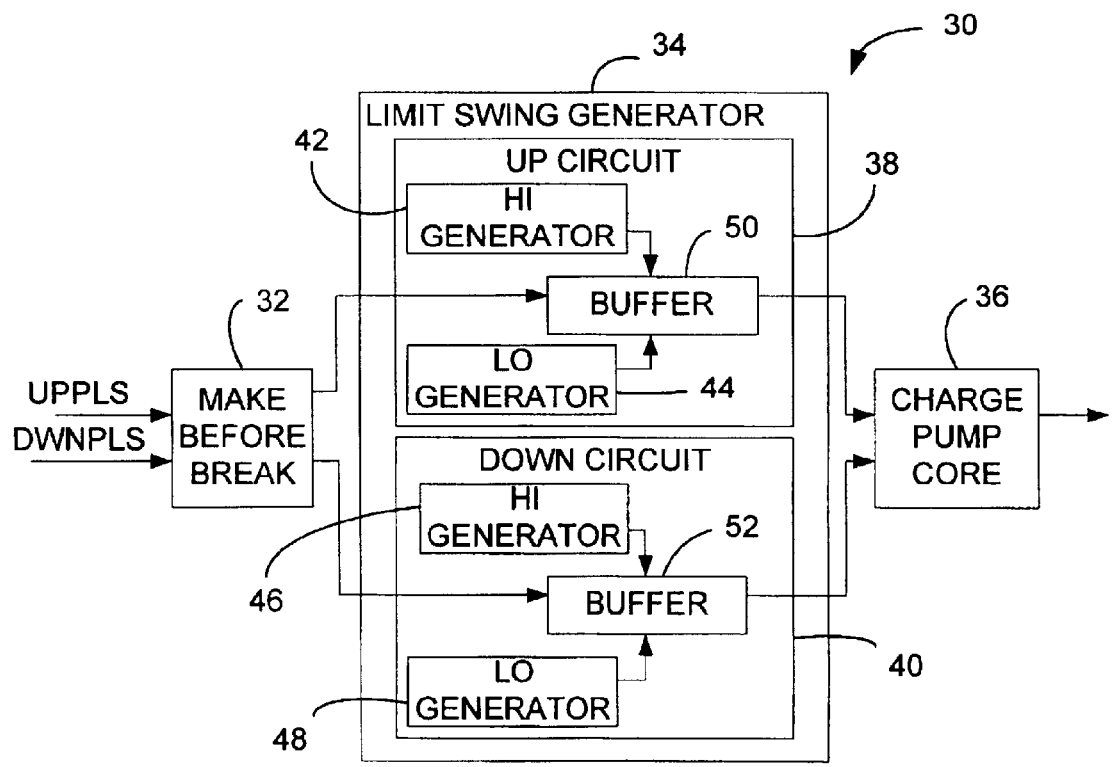
FIG. 2 is a block diagram of an aspect of a charge pump.

FIG. 2 shows an aspect of a charge pump 30 for generating an output voltage. A make-before-break circuit 32 for reducing static phase error is preferably included, although not required for the operation of the charge pump 30. In addition, any form of make-before-break circuit may be employed. The make-before-break circuit 32 may receive up pulses and down pulses from a phase detector and in response generate conditioned signals that force differential pairs of output switches in a charge pump core 36 to have overlapping conduction periods. By preventing the pairs of output switches from not continuously conducting current, static phase error is reduced.

Figure 3:
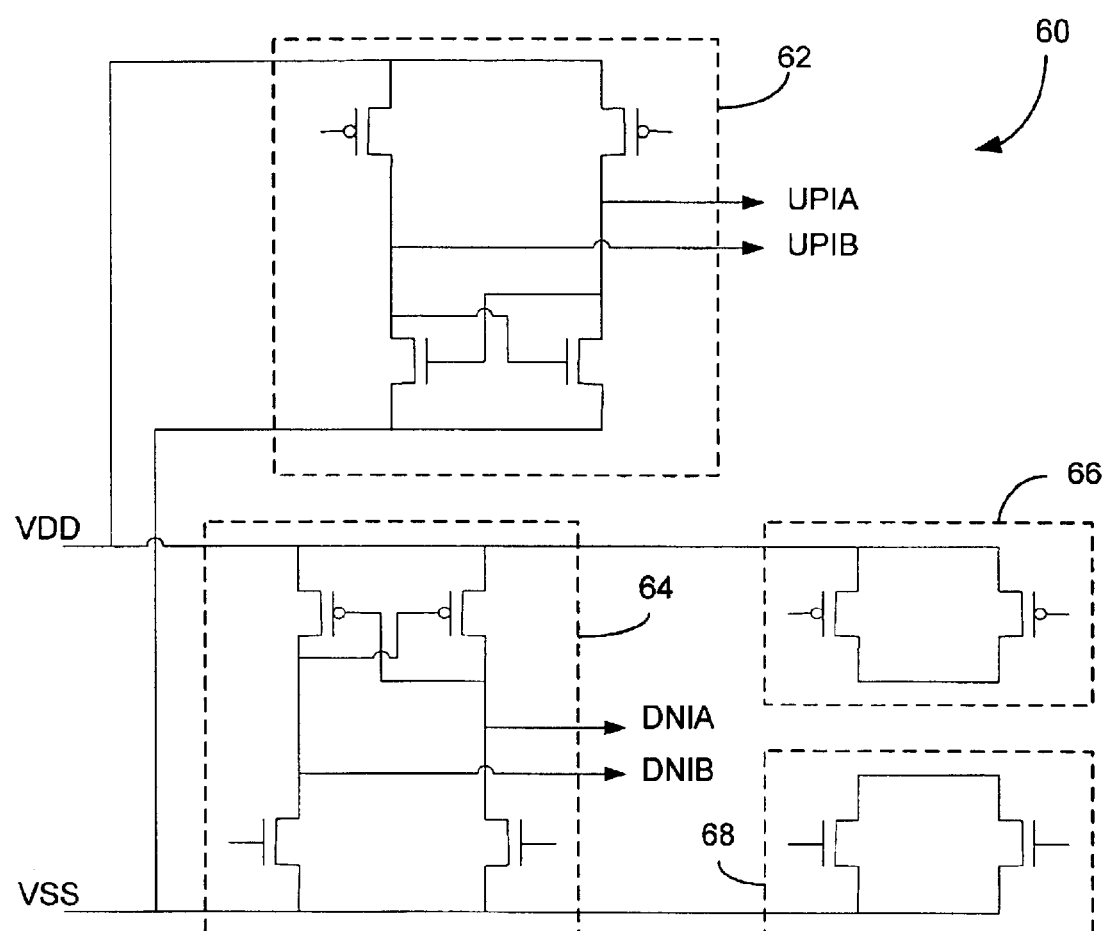
FIG. 3 is a block diagram of an aspect of a make-before-break circuit.

FIG. 3 shows a detailed schematic of an aspect of a make-before-break circuit 60. A cross-coupled latch 62 in an up signal path conditions signals for the upper switches (typically PMOS) in the charge pump core 36. Another cross-coupled latch 64 in a down signal path conditions the signals for the lower switches (typically NMOS) in the charge pump core. The latches 62 and 64 ensure that at least one of the switches of each differential pair in the charge pump core 36 conducts current at all times. For example, to ensure at least one of the PMOS switches in the charge pump core 36 is on, the upper path output signals overlap in the low state. Similarly, to ensure at least one of the NMOS switches in the charge pump core 36 is on, the lower path output signals overlap in the high state. To match the delays of the up and down signal paths, dummy loads 66 and 68 are added at each input to balance the loading on the previous stage.

Again referring to FIG. 2, a limit swing generator 34 controls the voltage levels of drive signals for the charge pump core 36. The limit swing generator 34 includes an up circuit 38 and a down circuit 40 to generate drive signals for the up switches and down switches respectively in the charge pump core 36. Each of the up circuit 38 and down circuit 40 includes hi and lo voltage generators 42–48 and a pair of buffers 50 and 52. The hi and lo voltage generators 42–48 provide a controlled voltage to the buffers 50 and 52 to control the voltage level of the drive signals for the charge pump core 36.

Figure 4:
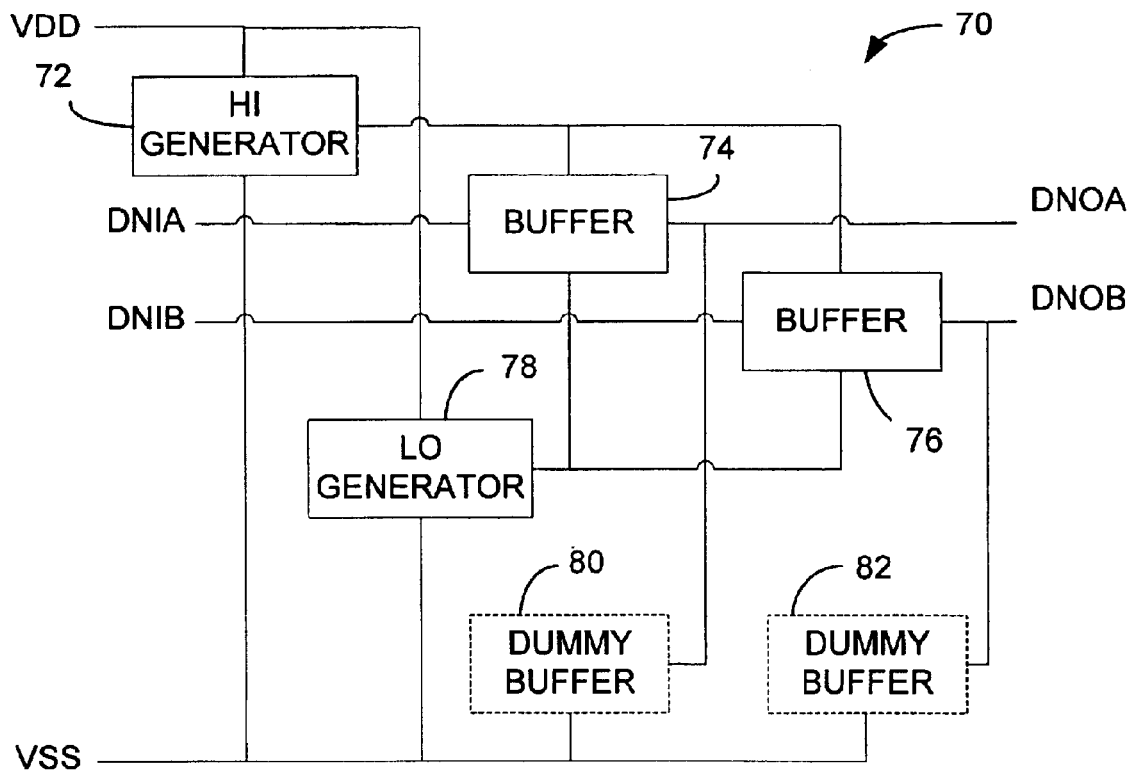
FIG. 4 is a schematic diagram of an aspect of a limit swing generator.

FIG. 4 shows a detailed block diagram of a down circuit 70 in a limit swing generator. An up circuit is similar in operation to the down circuit 70. A hi generator 72 derives an intermediate hi level voltage from the supply voltages Vdd and Vss. Similarly, a lo generator 78 derives an intermediate lo level voltage from Vdd and Vss. The intermediate hi and lo level voltages are controlled to track parametric changes in the output switches so that errors in the pulse width of the signals generated by the output switches are minimized. The intermediate level voltages may be generated with diodes that track the corresponding NMOS or PMOS output switches in the charge pump core 36 over all process corners so that a minimum drive level is supplied instead of overdriving the output switches. The intermediate hi and lo level voltages are supplied to the buffers 74 and 76. The buffers 74 and 76 convert input signals DNIA and DNIB to output signals DNOA and DNOB that have voltage levels based on the intermediate hi and lo voltages. Dummy buffers 80 and 82 may be connected to the outputs of the buffers 74 and 76 to compensate for clock feed through and/or charge injection.

Figure 5:
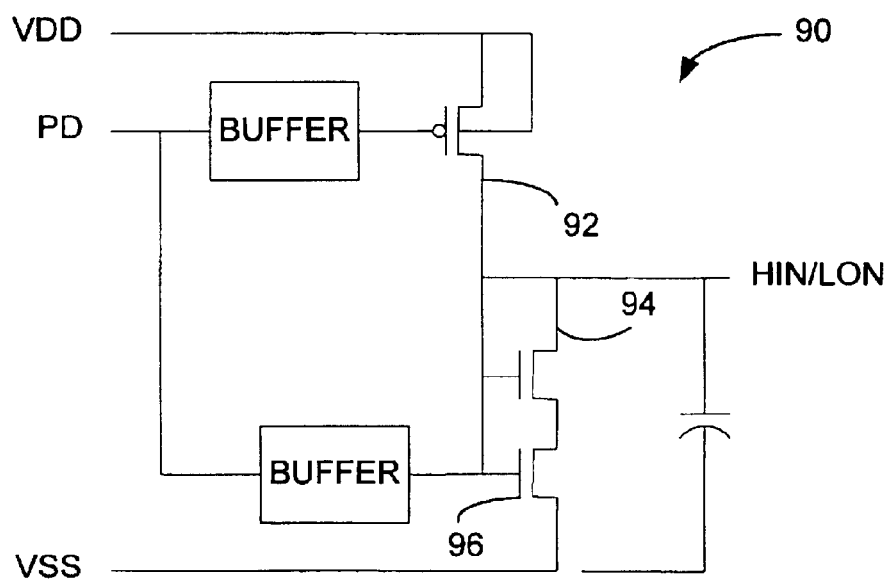
FIG. 5 is a schematic diagram of a low-side referenced voltage generator.

FIG. 5 shows a detailed schematic of a voltage generator 90 to generate an intermediate voltage level to be applied to the NMOS output switches. The voltage generator 90 is preferably referenced to Vss. A power disable signal, PD, provides on/off control for the switches 92–96. The upper switch 92 may be configured as a current source that supplies a current to the lower switches 94–96 which are configured as diodes. By sourcing a current to a diode, the source voltage operating range of the voltage generator is increased. The increased source voltage operating range allows the voltage generator 90 to operate with a lower voltage differential between Vdd and Vss. Specifically, the voltage generator 90 may generate a specific voltage level using a lower voltage differential between Vdd and Vss by sourcing current to a diode configured device. The lower switches 94 and 96 may be selected so that the generated voltage levels track parametric changes in the output switches causing the output switches to be operated in the saturation region. Although the voltage generator 90 preferably includes two switches configured as diodes in series, the scope of the invention includes using any number of diodes as well as switches configured as diodes ranging from one to multiple devices. In the illustrated two switch configuration, the switch 94 may be designed to match the NMOS output switches. Also, the switch 96 may be designed to match the tail current source associated with the output switches or to provide sufficient drive to turn off the off output switch in the charge pump core. In another aspect, a single switch may be selected to compensate for changes in both the NMOS output switches and the tail current source.

Figure 6:
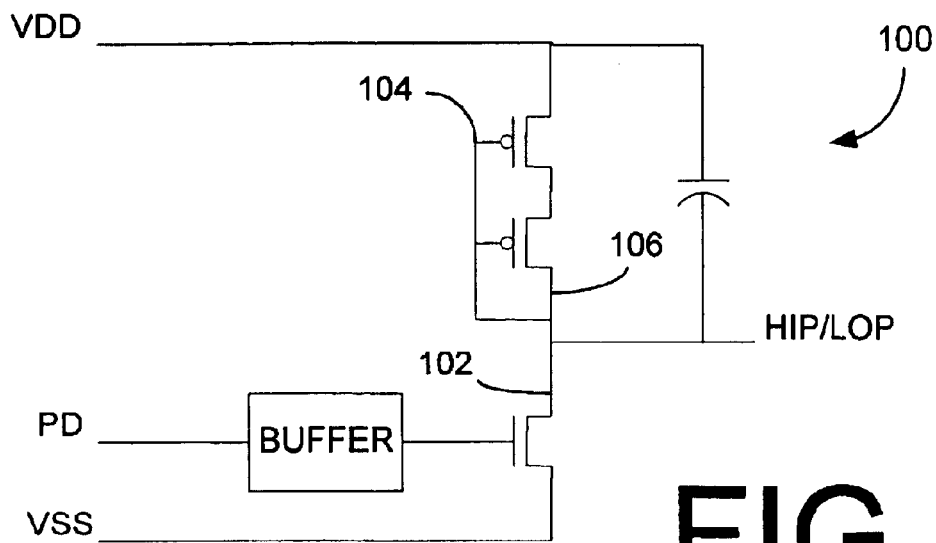
FIG. 6 is a schematic diagram of high-side referenced voltage generator.

FIG. 6 shows a detailed schematic of a voltage generator 100 to generate an intermediate voltage level to be applied to the PMOS output switches. The voltage generator 100 is similar in function to the voltage generator 90 although the voltage generator 100 is preferably referenced to Vdd. A power disable signal, PD, provides on/off control for the switches 102–106 which may be connected as diodes in in series with a current sink. The upper switches 104 and 106 may be configured as a pair of series diodes so that the generated voltage levels track parametric changes in the output switches causing the output switches to be operated in the saturation region. Although the voltage generator 100 preferably includes two switches configured as diodes in series, the scope of the invention includes using any number of diodes including switches configured as diodes ranging from one device to multiple devices. In a two diode configuration, the switch 104 may be designed to match the PMOS output switches and the switch 106 may be designed to match the tail current source associated with the output switches or to provide sufficient drive to turn off the off output switch in the charge pump core. In another aspect, a single switch may be selected to compensate for changes in both the PMOS output switches and the tail current source.

Figure 7:
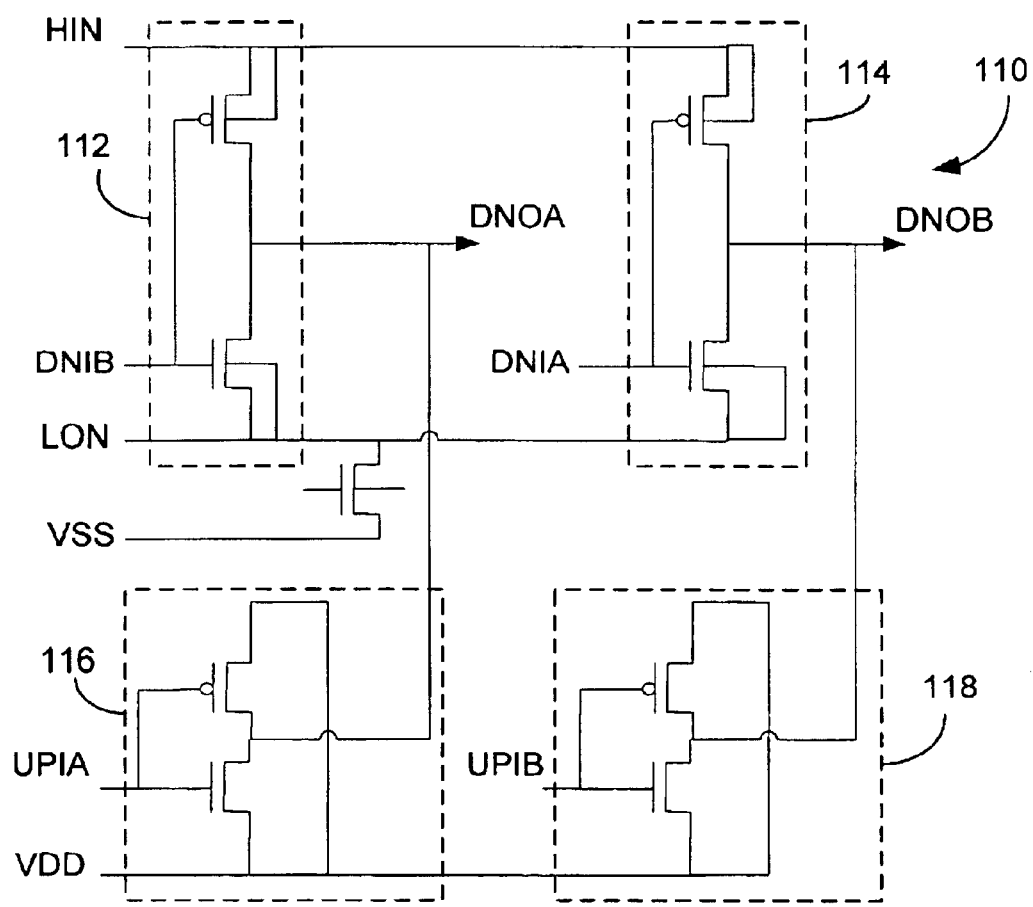
FIG. 7 is a schematic diagram of an aspect of down inverters in a limit swing generator.

FIG. 7 shows a detailed schematic of an aspect of a limit swing generator down circuit 110. The down circuit 110 includes two inverters 112 and 114 to generate inverted drive signals having voltage levels based on intermediate voltages HIN and LON. Dummy inverters 116 and 118 may be coupled to the outputs of the inverters 112 and 114 to cancel clock feed through and/or charge injection.

Figure 8:
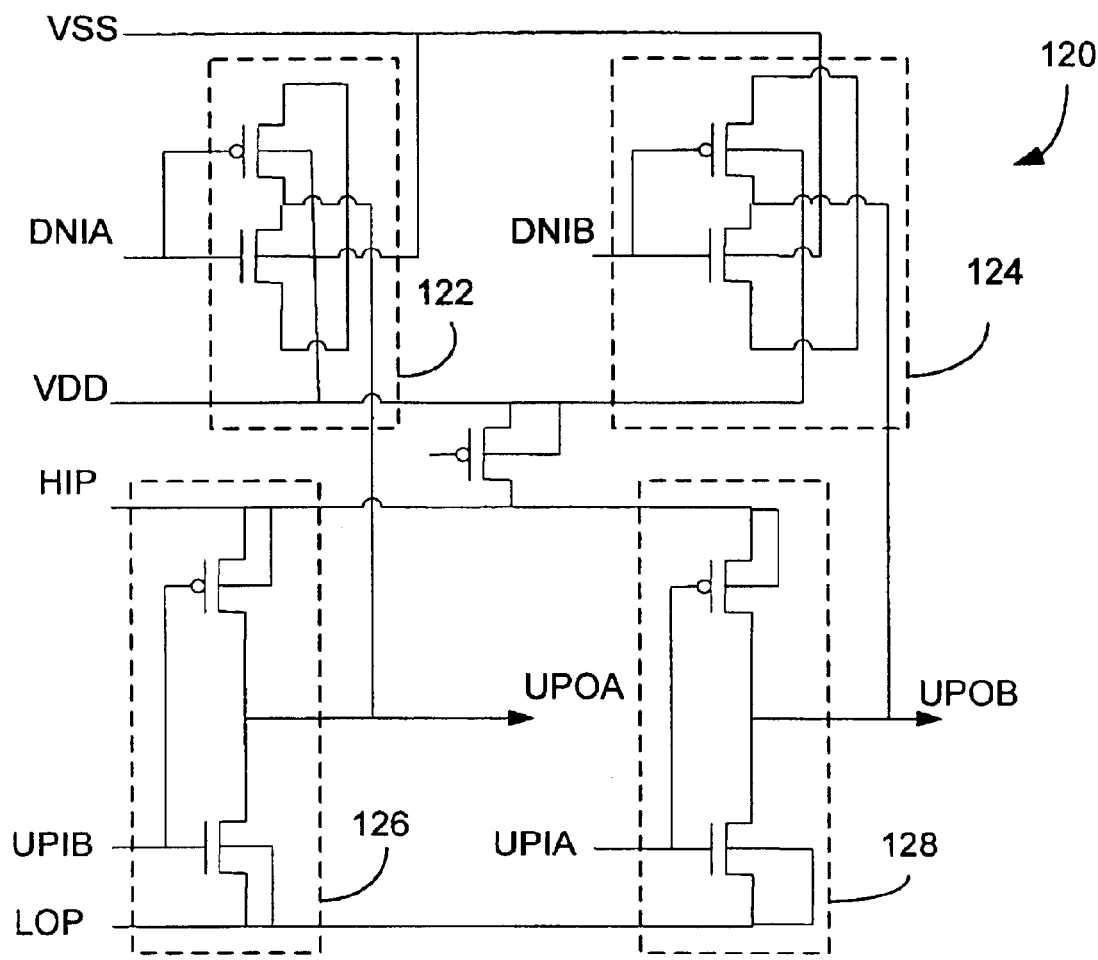
FIG. 8 is a schematic diagram of an aspect of up inverters in a limit swing generator.

FIG. 8 shows a detailed schematic of an aspect of a limit swing generator up circuit 120. The up circuit operates in a similar function to the down circuit 120 with corresponding elements numbered in the range 122 to 128.

Figure 9:
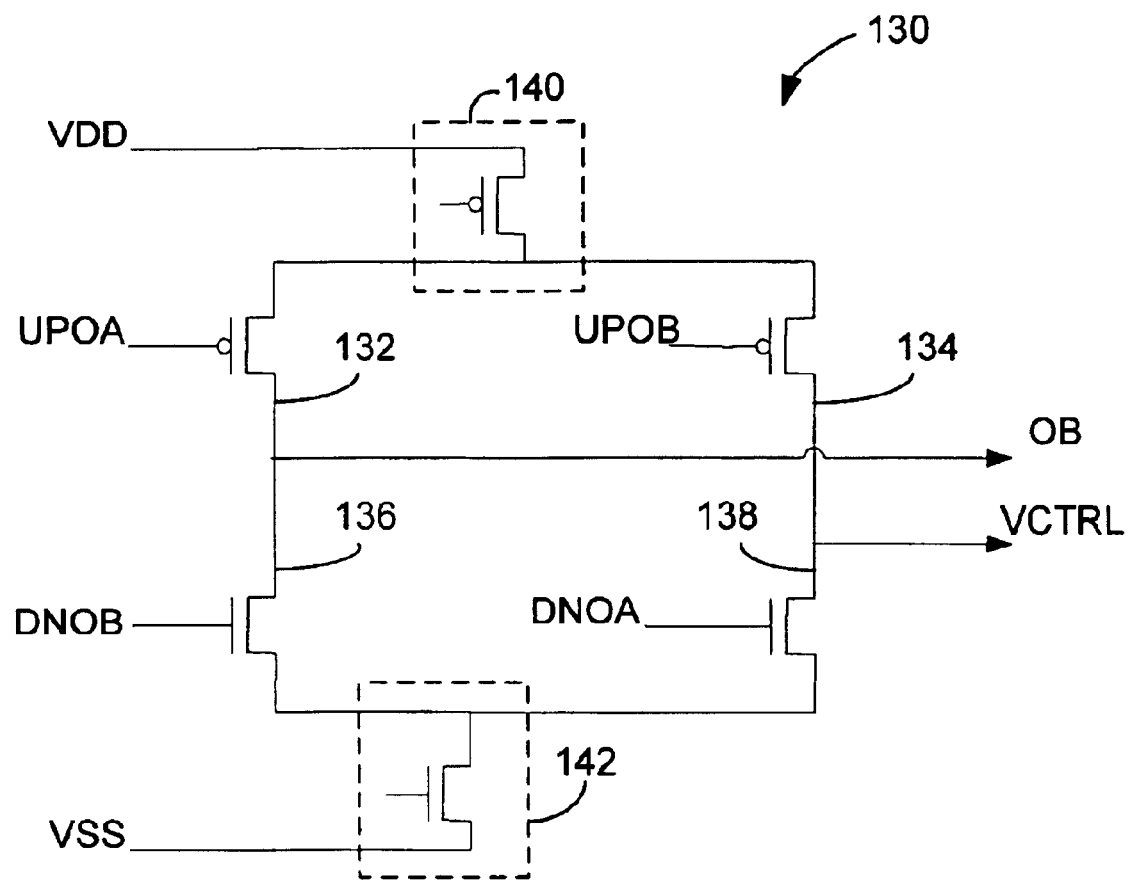
FIG. 9 is a schematic diagram of an aspect of a charge pump core.

FIG. 9 shows a detailed schematic of an aspect of a charge pump core 130 for generating an output current corresponding to up and down pulses received from a phase detector. The charge pump core 130 includes a set of output switches 132–138 that are formed into two differential pairs, an up differential pair of switches 132–134 and a down differential pair of switches 136–138. An up tail current source 140 supplies current to the up differential pair of switches 132–134. A down tail current source 142 supplies current to the down differential pair of switches 136–138.

The limit swing generator voltage generators preferably include switches that are selected based on the charge pump core switches 132–138. For example, the hi generator for the limit swing generator down buffers may include two NMOS switches connected in series that may be described by physical characteristics that include width, length, and number of fingers (M). One of the hi generator NMOS switches 94 may have physical characteristics that are based on the physical characteristics of the charge pump core down switches 136–138. The other of the hi generator NMOS switches 95 may have physical characteristics that are similar to the physical characteristics of the charge pump core down tail current source 142. In one example, the charge pump core down switches 136–138 have W=27.5, L=11.5, and M=8, while the hi generator NMOS switch 94 has W=27.5, L=11.5, and M=16. The nominal voltage generated by the hi generator NMOS switch 95 may be controlled by the selection of the width-to-length ratio for the device. The charge pump core down tail current source 142 has W=110, L=110, and M=8, while the hi generator NMOS switch 95 has W=24, L=110, and M=8. Preferably the nominal voltage levels of the hi and lo generators are selected to provide proper operation of the charge pump core output switches at nominal process and operating conditions. Then, as process and/or operating conditions vary, the performance characteristics of the hi and lo generators change to mirror changes in the performance characteristics of the output switches. For example, differences in parametric variables such as transconductance, voltage threshold, and bias current of the output switches caused during manufacture of several devices may be mirrored by similar changes in the limit swing generators so that different devices will operate similarly.

Similarly, the lo generator for the limit swing generator down buffers may include two NMOS switches connected in series. One of the lo generator NMOS switches 104 may have physical characteristics that are based on the physical characteristics of the charge pump core down switches 136–138. The other of the lo generator NMOS switches 106 may have physical characteristics that are selected to ensure turn-off of the off switch of the NMOS switches in the charge pump core. In one example, the charge pump core down switches 136138 have W=27.5, L=4.5, and M=8, while the lo generator NMOS switch 104 has W=27.5, L=11.5, and M=16. Here, the length of the NMOS switch 104 is selected to provide a nominal voltage level. The lo generator NMOS switch 106 has W=110, L=3, and M=8.

The up circuit limit swing generator voltage generators include switches that may be selected in a manner similar to the down circuit limit swing generator voltage generators.

Figure 10:
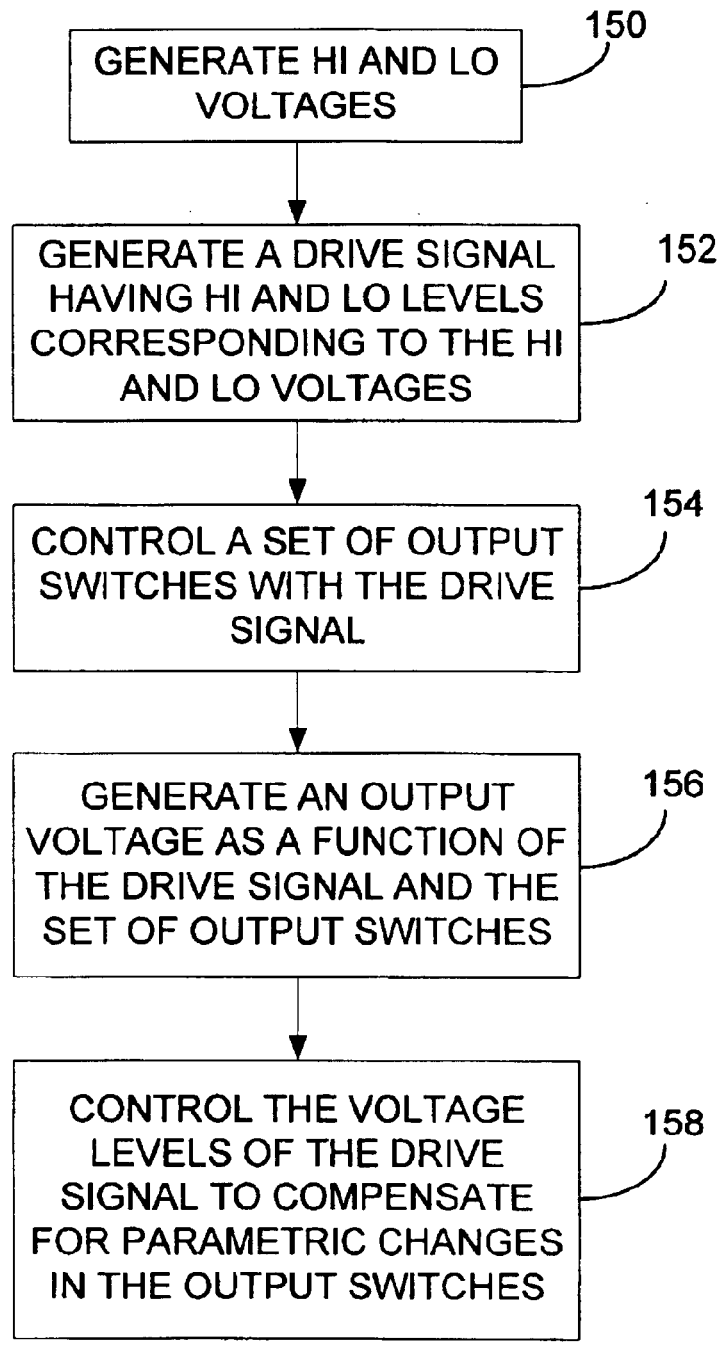
FIG. 10 is a flow diagram of an aspect of generating a charge pump output voltage.

FIG. 10 shows the operation of an aspect of a limit swing charge pump. Beginning at block 150, hi and lo voltages are generated from Vdd and Vss. The hi voltage is less than Vdd and the lo voltage is greater than Vss. A drive signal having two voltage levels is generated from an input signal. The voltage levels of the drive signal are derived from the hi and lo voltages, block 152. The drive signal voltage levels may be setup under low supply voltage, Vdd and Vss, conditions. The drive signal is used to control a set of output switches, block 154. The output switches generate an output current with energy from the Vdd and Vss voltage sources, block 156. To compensate for parametric changes in the output switches, the hi and lo voltages may be individually controlled for the NMOS and PMOS pairs, block 158. For example, the hi voltage may be selected with low supply voltages to be proportional to Vds of a tail current source plus Vgs of an output switch. Controlling the hi and lo voltages causes corresponding changes in the voltage levels of the drive signal which changes the drive to the set of output switches thereby compensating for the parametric change in the output switches.

A number of embodiments of the invention have been described. Nevertheless, it will be understood that various modifications may be made without departing from the spirit and scope of the invention. Accordingly, other embodiments are within the scope of the following claims.

What is claimed is:

1. A charge pump comprising:
  a charge pump core including output switches, in response to a drive signal, to generate a charge pump output;
  a limit swing generator, in response to an input signal, to generate the drive signal to control the charge pump core, the drive signal having voltage levels including a high level and a low level, the limit swing generator including at least one voltage generator to control the voltage levels of the drive signal such that the drive signal tracks a parametric variable of the output switches; and
  the at least one voltage generator including at least one device having a performance parameter that is proportional to Vds+Vt of said output switches.

2. The charge pump of claim 1 wherein the at least one device includes a first MOS transistor.

3. The charge pump of claim 1 wherein the at least one voltage generator further includes a current source to supply current to the at least one device.

4. The charge pump of claim 3 wherein the current source includes a second MOS transistor.

5. The charge pump of claim 1 wherein the limit swing generator further includes signal buffers including a down buffer and an up buffer; and
  at least one dummy circuit coupled to the signal buffers to compensate for signal buffer error.

6. The charge pump of claim 5 wherein the signal buffer error is selected from a group comprising charge injection and clock feedthrough.

7. The charge pump of claim 1 wherein the charge pump is included in a wireless Local Area Network (LAN) device that is IEEE 802.11 compliant.

8. A charge pump comprising:
  means for generating a charge pump output in response to a drive signal;
  means for generating a drive signal in response to an input signal, the drive signal to control the charge pump generating means, the drive signal having voltage levels including a high level and a low level, the drive signal generating means including at least one means for generating voltage to control the voltage levels of the drive signal such that the drive signal tracks a parametric variable of the charge pump output generating means; and
  the at least one voltage generating means including at least one device having a performance parameter that is proportional to Vds+Vt of said means for generating said charge pump output.

9. The charge pump of claim 8 wherein the at least one device includes a first MOS transistor.

10. The charge pump of claim 8 wherein the at least one voltage generating means further includes a current source to supply current to the at least one device.

11. The charge pump of claim 10 wherein the current source includes a second MOS transistor.

12. The charge pump of claim 8 wherein the drive signal generating means further includes signal buffers including a down buffer and an up buffer.

13. The charge pump of claim 12 wherein the drive signal generating means further includes at least one dummy circuit coupled to the signal buffers to compensate for signal buffer error.

14. The charge pump of claim 13 wherein the signal buffer error is selected from a group comprising charge injection and clock feedthrough.

15. The charge pump of claim 8 wherein the charge pump is included in a wireless Local Area Network (LAN) device that is IEEE 802.11 compliant.

16. A method for generating a regulated voltage, comprising:
   providing an output circuit to generate an output voltage from first and second voltages;
   generating a drive signal to control the output circuit, the drive signal having first and second voltage levels;
   controlling the output circuit as a function of the drive signal;
   controlling the drive signal first and second voltage levels to compensate for parametric changes in the output circuit;
   generating the drive signal includes generating a first current;
   supplying the first current to at least one device in said output circuit such that a voltage is developed across the at least one device which is proportional to Vds+Vt; and
   setting at least one of the voltage levels using the voltage developed across the at least one device.

17. The method of claim 16 wherein the at least one device includes a first MOS transistor.

18. The method of claim 16 wherein generating the current includes using a second MOS transistor as a current source.

19. The method of claim 16 wherein the drive signal includes an up path and a down path; and
   compensating for error between the up path and the down path.

20. The method of claim 19 wherein the error is selected from a group consisting of charge injection and clock feedthrough.

21. The charge pump of claim 1 wherein the at least one adevice having a performance parameter that is proportional to Vdsat+Vt.

22. The charge pump of claim 8 wherein the at least one device which is proportional to Vds+Vt is proportional to Vdsat+Vt.

23. The method of claim 16 wherein the at least one device has a performance parameter that is proportional to Vdsat+Vt.

* * * * *

UNITED STATES PATENT AND TRADEMARK OFFICE
CERTIFICATE OF CORRECTION

PATENT NO. : 7,064,600 B1
APPLICATION NO. : 10/703375
DATED : June 20, 2006
INVENTOR(S) : Jun Ming et al.

It is certified that error appears in the above-identified patent and that said Letters Patent is hereby corrected as shown below:

Column 4, Line 28    Delete second occurrence of "in"
Column 5, Line 41    Delete "136138" and insert --136-138--
Column 5, Line 56    Delete "setup" and insert --set up--
Column 6, Line 54    Delete "generating means" and insert --generator--
Column 8, Line 17    Delete "adevice" and insert --device--

Signed and Sealed this

Sixth Day of March, 2007

JON W. DUDAS
*Director of the United States Patent and Trademark Office*